(12) United States Patent
Qian et al.

(10) Patent No.: US 11,074,980 B2
(45) Date of Patent: Jul. 27, 2021

(54) NON-VOLATILE MEMORY DEVICE WITH STORED INDEX INFORMATION

(71) Applicant: Silicon Storage Technology, Inc., San Jose, CA (US)

(72) Inventors: Xiaozhou Qian, Shanghai (CN); Xiao Yan Pi, Shanghai (CN); Vipin Tiwari, Dublin, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

(21) Appl. No.: 16/813,317

(22) Filed: Mar. 9, 2020

(65) Prior Publication Data

US 2021/0082517 A1 Mar. 18, 2021

(30) Foreign Application Priority Data

Sep. 17, 2019 (CN) .......................... 201910875107.3

(51) Int. Cl.
*G11C 16/14* (2006.01)
*G11C 7/10* (2006.01)
*G11C 16/28* (2006.01)

(52) U.S. Cl.
CPC ............ *G11C 16/14* (2013.01); *G11C 7/1039* (2013.01); *G11C 7/1045* (2013.01); *G11C 16/28* (2013.01)

(58) Field of Classification Search
CPC ..................................................... G11C 16/14
See application file for complete search history.

(56) References Cited

U.S. PATENT DOCUMENTS

| 5,029,130 | A | 7/1991 | Yeh | |
| 5,517,453 | A * | 5/1996 | Strain | G11C 16/16 365/185.04 |
| 9,646,700 | B2 | 5/2017 | Tran et al. | |
| 9,830,983 | B1 | 11/2017 | Hara | |
| 2010/0074007 | A1 | 3/2010 | Parker | |
| 2010/0229001 | A1* | 9/2010 | Park | G11C 16/22 713/190 |
| 2015/0228338 | A1* | 8/2015 | Manda | G06F 11/1076 365/163 |
| 2018/0059968 | A1* | 3/2018 | Jung | G06F 3/0619 |
| 2018/0059971 | A1 | 3/2018 | Jung | |
| 2018/0261285 | A1 | 9/2018 | Hattori | |
| 2019/0103165 | A1 | 4/2019 | Um | |

* cited by examiner

*Primary Examiner* — Douglas King
(74) *Attorney, Agent, or Firm* — DLA Piper LLP (US)

(57) ABSTRACT

A memory device that includes a memory array having pluralities of non-volatile memory cells, a plurality of index memory cells each associated with a different one of the pluralities of the non-volatile memory cells, and a controller. The controller is configured to erase the pluralities of non-volatile memory cells, set each of the index memory cells to a first state, and program first data into the memory array by reading the plurality of index memory cells and determining that a first one of the index memory cells is in the first state, programming the first data into the plurality of the non-volatile memory cells associated with the first one of the index memory cells, and setting the first one of the index memory cells to a second state different from the first state.

15 Claims, 8 Drawing Sheets

NON-VOLATILE MEMORY DEVICE WITH STORED INDEX INFORMATION

RELATED APPLICATION

This application claims the benefit of Chinese Patent Application No. 201910875107.3, filed on Sep. 17, 2019.

FIELD OF THE INVENTION

The present invention relates to non-volatile memory devices.

BACKGROUND OF THE INVENTION

Non-volatile memory devices are well known. For example, U.S. Pat. No. 5,029,130 ("the '130 patent"), which is incorporated herein by reference, discloses an array of split gate non-volatile memory cells, which are a type of flash memory cells. Each memory cell can be repeatedly programmed to a program state or erased to an erased state. These two memory states represent stored digital information (e.g., program state: "0"; erased state: "1"). The state of the memory cell can then be read during a read operation. It is also possible to operate each memory cell with more than two possible memory states, which is often referred to as MLC (multi-level cell). The memory cells are referred to as non-volatile because their memory state is maintained even if power is removed from the device. The device is referred to as flash memory because groups of memory cells are erased together in a single erase operation.

The memory cells can be grouped in physical words. For example, each physical word can include 8 or 16 memory cells. A plurality of physical words can be grouped together to form a sector, and a plurality of sectors can be grouped together to form a plane. A memory device can include one or more planes. While flash memory devices can typically program and read memory cells individually, they are usually configured to erase memory cells in larger groups such as sector by sector. This is done to speed up the erase operation and simplify the memory array architecture. However, this means that if one or more memory cells in a given sector need erasing, then the entire sector must be erased.

Typically, write operations are performed word by word, where the incoming data to be stored is grouped into words, and each data word is programming into a physical word of memory cells. For most flash memory devices, the memory cells must be in their erased state before programming can occur. Therefore, most flash memory devices are configured to erase a physical word of memory cells before programming them with data. Otherwise, there is a risk of programming errors (e.g., over programming of previously programmed cells, or previously programmed cells that are to be in the erased state, but remain in their programmed state). By erasing all the memory cells immediately before programming, any previous programming will be removed from the cells first. Therefore, to program a target physical word of memory cells, the entire sector in which the target physical word is located is erased, which is then followed by programming the target physical word. If the other physical words in the same sector were previously used to store data before the sector erase, they would have to be reprogrammed with that data. This configuration suffers several drawbacks. First, the program operation time is lengthened because each time a physical word is programmed, the entire sector is erased first. Second, each physical word of memory cells is erased and reprogrammed each time another physical word in the same sector is programmed. This limits the lifetime of the memory device, because non-volatile memory cells can only endure a certain number of erase/program cycles before exhibiting signs of wear. Eventually, excessive wear could render the memory cells inoperative.

There is a need for a better technique to program physical words in a sector, where the sector is the smallest erasable unit, without disturbing other physical words in the same sector that are not being programmed.

BRIEF SUMMARY OF THE INVENTION

The aforementioned problems and needs are addressed by a memory device that includes a memory array having pluralities of non-volatile memory cells, a plurality of index memory cells each associated with a different one of the pluralities of the non-volatile memory cells, and a controller. The controller is configured to erase the pluralities of non-volatile memory cells, set each of the index memory cells to a first state, and program first data into the memory array by reading the plurality of index memory cells and determining that a first one of the index memory cells is in the first state, programming the first data into the plurality of the non-volatile memory cells associated with the first one of the index memory cells, and setting the first one of the index memory cells to a second state different from the first state.

A method of operating a memory device (that comprises a memory array that includes pluralities of non-volatile memory cells and a plurality of index memory cells each associated with a different one of the pluralities of the non-volatile memory cells), the method including erasing the pluralities of non-volatile memory cells, setting each of the index memory cells to a first state, and programming first data into the memory array by reading the plurality of index memory cells and determining that a first one of the index memory cells is in the first state, programming the first data into the plurality of the non-volatile memory cells associated with the first one of the index memory cells, and setting the first one of the index memory cells to a second state different from the first state.

Other objects and features of the present invention will become apparent by a review of the specification, claims and appended figures.

DETAILED DESCRIPTION OF THE INVENTION

Figure 1:
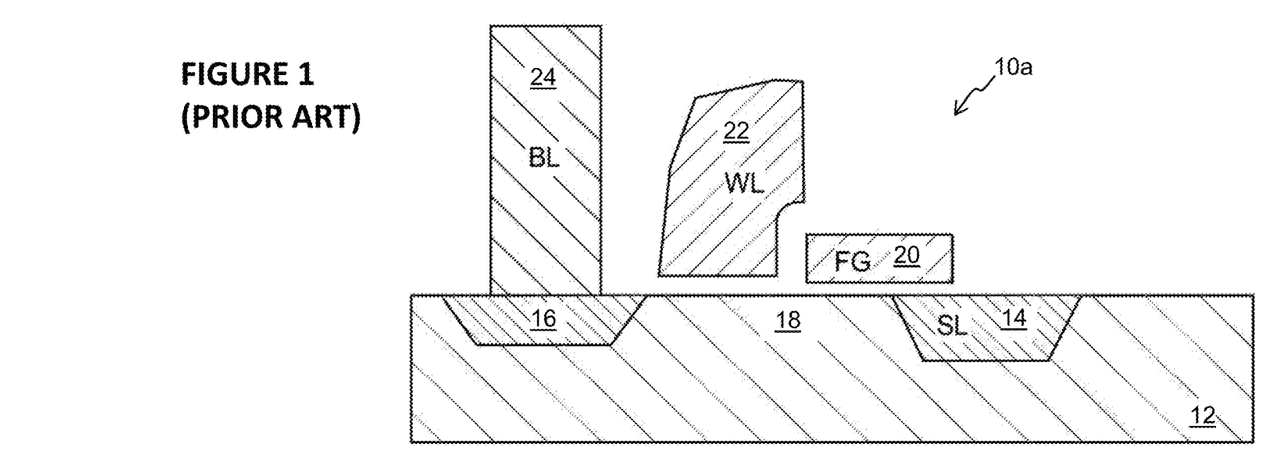
FIGS. 1-6 are side cross sectional views of conventional non-volatile memory cells.

The present invention is a memory device and technique that allows flash memory devices to program physical words without unduly disturbing other physical words in the same sector with unnecessary erase operations. FIGS. 1-6 illustrate examples of the types of conventional non-volatile memory cells that can benefit from the present invention. For example, as shown in FIG. 1, a memory cell 10a includes source region 14 (which is typically formed as a continuous source line SL) and drain region 16 formed in semiconductor substrate 12, with channel region 18 there between. Floating gate 20 is formed over and insulated from (and controls the conductivity of) a first portion of the channel region 18, and over a portion of the source region 14. Word line gate 22 (which is typically coupled to a word line) has a first portion that is disposed over and insulated from (and controls the conductivity of) a second portion of the channel region 18, and a second portion that extends up and over the floating gate 20. The floating gate 20 and word line gate 22 are insulated from the substrate 12 by a gate oxide. Bit line contact 24 is coupled to drain region 16 (for electrical connection to a bit line).

Memory cell 10a is erased (where electrons are removed from the floating gate) by placing a high positive voltage on the word line gate 22, which causes electrons on the floating gate 20 to tunnel through the intermediate insulation from the floating gate 20 to the word line gate 22 via Fowler-Nordheim tunneling. Memory cell 10a is programmed (where electrons are placed on the floating gate 20) by placing a positive voltage on the word line gate 22, and a positive voltage on the source region 14. Electron current will flow from the source region 14 towards the drain region 16. The electrons will accelerate and become heated when they reach the gap between the word line gate 22 and the floating gate 20. Some of the heated electrons will be injected through the gate oxide onto the floating gate 20 due to the attractive electrostatic force from the floating gate 20 (i.e., hot electron injection). Memory cell 10a is read by placing positive read voltages on the drain region 16 and word line gate 22 (which turns on the portion of the channel region 18 under the word line gate 22). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state. It is also possible to program the memory cell 10a at a number of intermediate states when used in a MLC operation.

Figure 2:
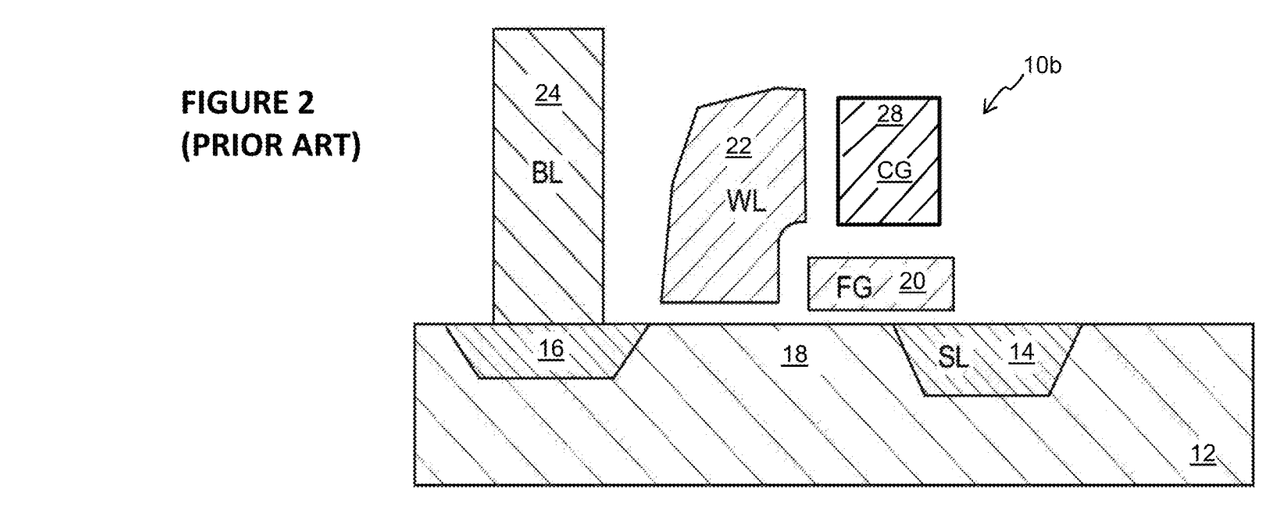

FIG. 2 shows another memory cell 10b, which is similar to memory cell 10a of FIG. 1 with the addition of control gate (CG) 28 that is disposed over and insulated from floating gate 20. Control gate 28 can be biased at a high voltage in programming, a low or negative voltage during erase, and a low or mid-range voltage during read.

Figure 3:
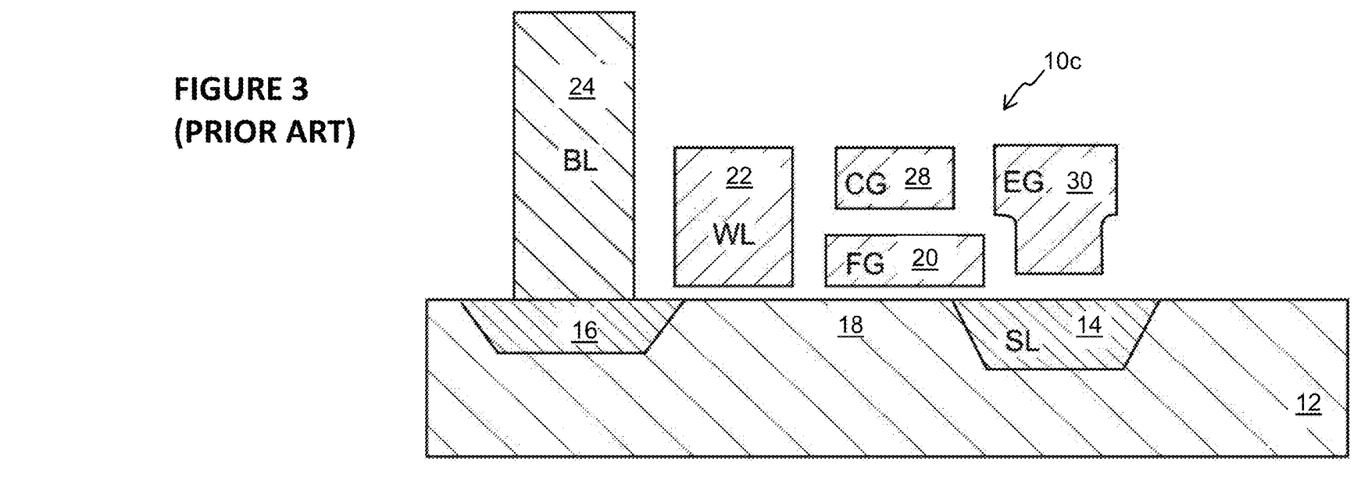

FIG. 3 depicts four-gate memory cell 10c, which is similar to memory cell 10b of FIG. 1 with the addition of erase gate 30 over the source region 14 that extends up and over the floating gate 20. Erasing is performed by electrons tunneling from the floating gate 20 to the erase gate 30 when a high positive voltage is placed on the erase gate 30.

Figure 4:
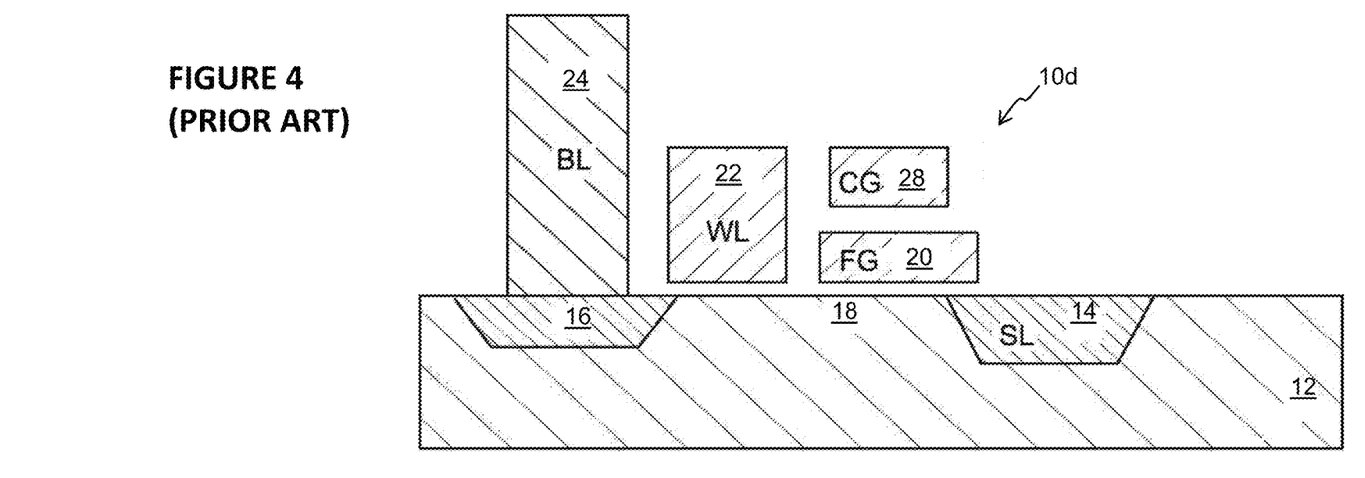

FIG. 4 shows memory cell 10d, which is similar to memory cell 10b of FIG. 2 except that the word line gate 22 does not extend up and over the floating gate 20. This memory cell is erased by biasing the substrate 12 to a high voltage and biasing the control gate CG 28 to a low or negative voltage, so that electrons will tunnel from the floating gate 20 to the substrate 12.

Figure 5:
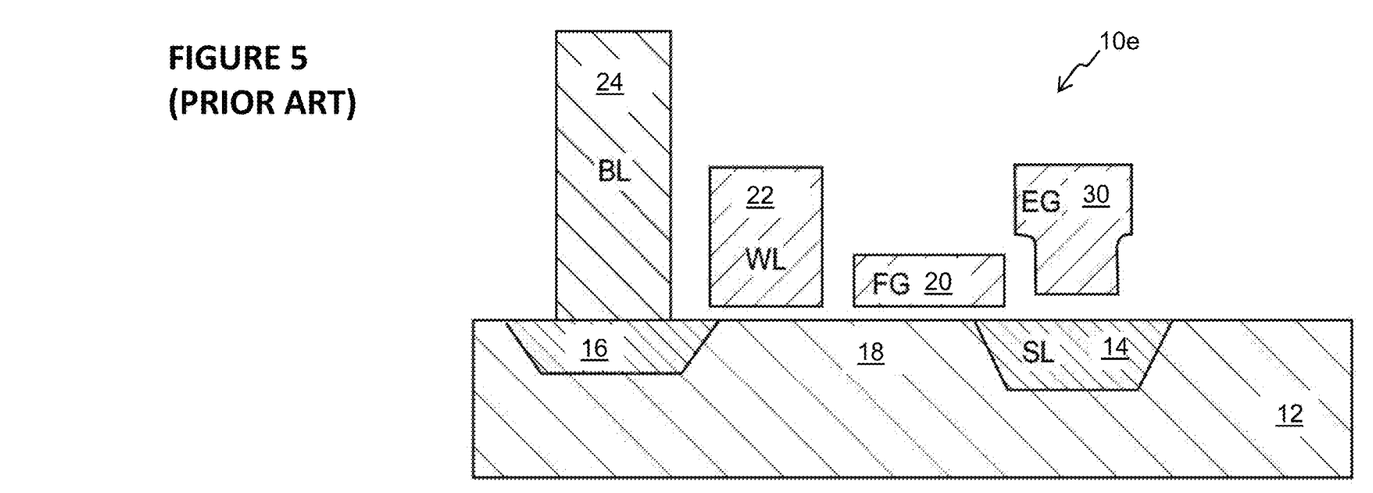

FIG. 5 shows memory cell 10e, which is similar to memory cell 10c of FIG. 3 but there is no separate control gate over the floating gate 20.

Figure 6:
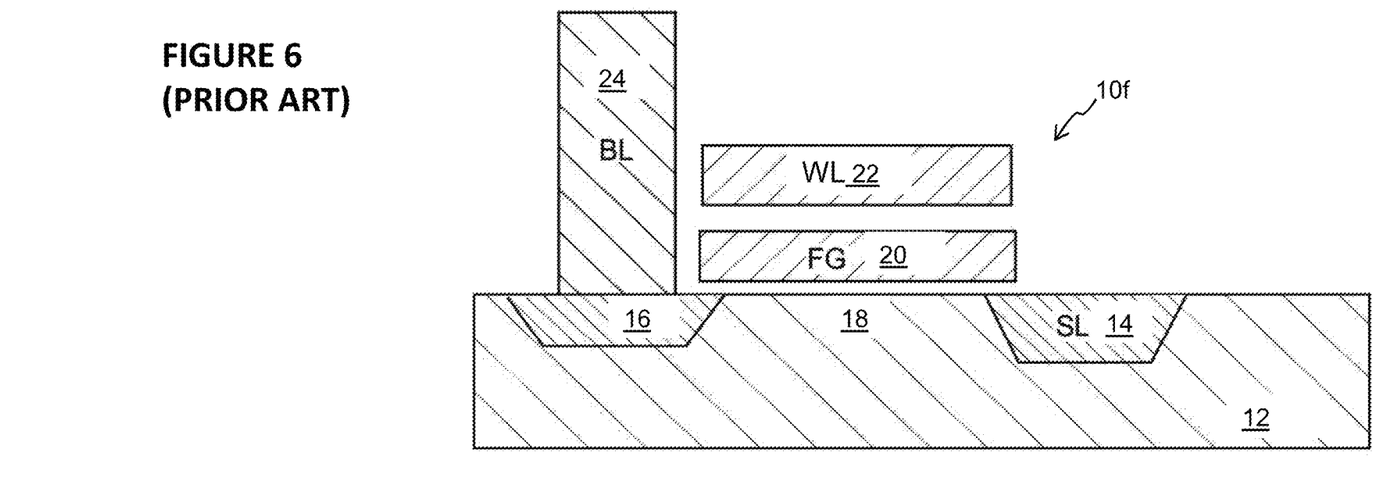

FIG. 6 shows memory cell 10f, which is a stacked gate memory cell instead of a split gate memory cell. In this stacked gate configuration, the floating gate 20 extends over (and controls the conductivity of) the entirety of the channel region 18. The word line gate 22 is disposed over and insulated from the floating gate 20. This memory cell is programmed by placing a positive voltage on the word line gate 22, which is coupled to the floating gate for programming in a similar manner as described above. The memory cell is erased by placing a zero or negative voltage on the word line gate 22 and a positive voltage on the substrate 12, to induce electrons to tunnel from the floating gate 20 to the substrate 12. The memory cell is read by placing a zero or positive voltage on the word line gate 22 and a positive voltage on the drain region 16.

Figure 7:
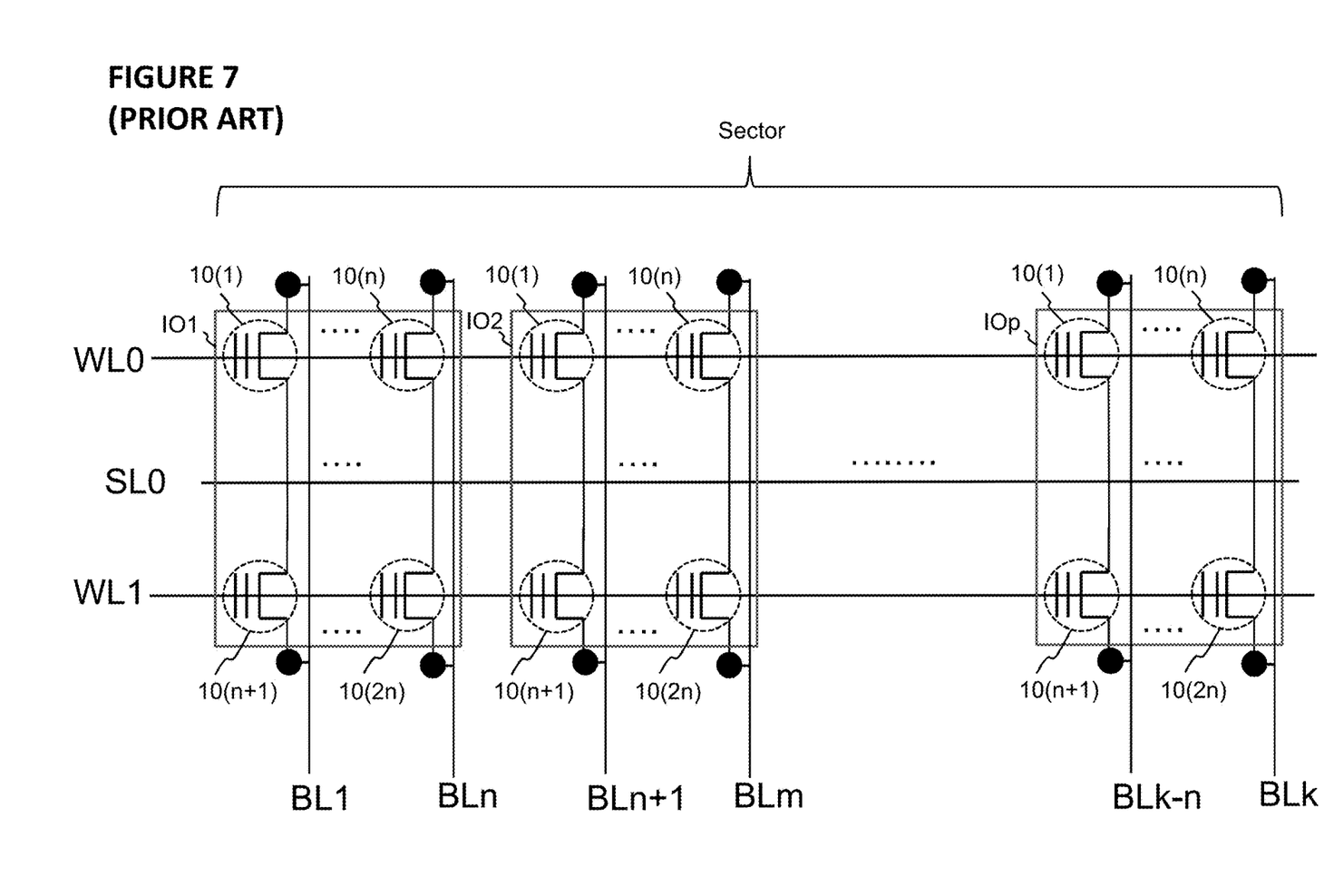
FIG. 7 is a schematic and layout drawing for a conventional memory array.

FIG. 7 illustrates a conventional architecture for non-volatile memory cells 10 (which are shown schematically as stacked gate cells 10f of FIG. 6, but can be any non-volatile memory cell including any of memory cells 10a-10f described above). The memory cells 10 are arranged in rows and columns. Each word line WL connects together all the word line gates 22 for all the memory cells 10 in one row. Each bit line BL connects together all of the drain regions 16 for all the memory cells 10 in one column. Each source line SL connects together all the source regions 14 for all the memory cells 10 in two adjacent rows. Additional lines may be included if there are additional gates in each memory cell. The memory cells 10 are divided into sectors S, where each sector includes groups of cells (e.g., input/output groups —IO groups). Each IO group includes n memory cells in each of two or more adjacent rows. There are p number of IO groups along the length of the rows in each sector. The memory device is configured to erase the entire sector of memory cells together in a single erase operation.

As a non-limiting example, n can equal 8, p can equal 8, and the number of rows in each IO group can be 2 (a top row and a bottom row) as shown in FIG. 7. In such a case, there are 16 memory cells 10 in each IO group (8 memory cells 10(1)-10(8) in the top row and 8 memory cells 10(9)-10(16) in the bottom row). And, there are 8 IO groups (IO1, IO2 . . . IO8) for the two rows of memory cells. An efficient way to allocate physical words in such an array is to include one memory cell 10 from each IO group to form a physical word. For example, the first memory cell in the top row of each IO group, 10(1), would collectively form the first physical word. The second memory cell in the top row of each IO group, 10(2), would collectively form a second physical word, and so on, where the last memory cell in the bottom row of each IO group, 10(2n), would form the last physical word. In this example, each physical word would include 8 memory cells (one from each IO group), and there would be 16 physical words in IO groups IO1-IO8 shown in FIG. 7. This is efficient because an entire physical word can be read out on the bit lines BL simultaneously because each memory cell 10 for a physical word is located on a different bit line. However, conventionally, when the first physical word is to be programmed with data, it is erased first to ensure all the memory cells can be accurately programmed (i.e., no previous programming would affect the programming of these cells). To erase the first physical word, however, all the physical words in the sector are erased and reprogrammed as necessary. This is time consuming and excessively wears the memory cells.

Figure 8:
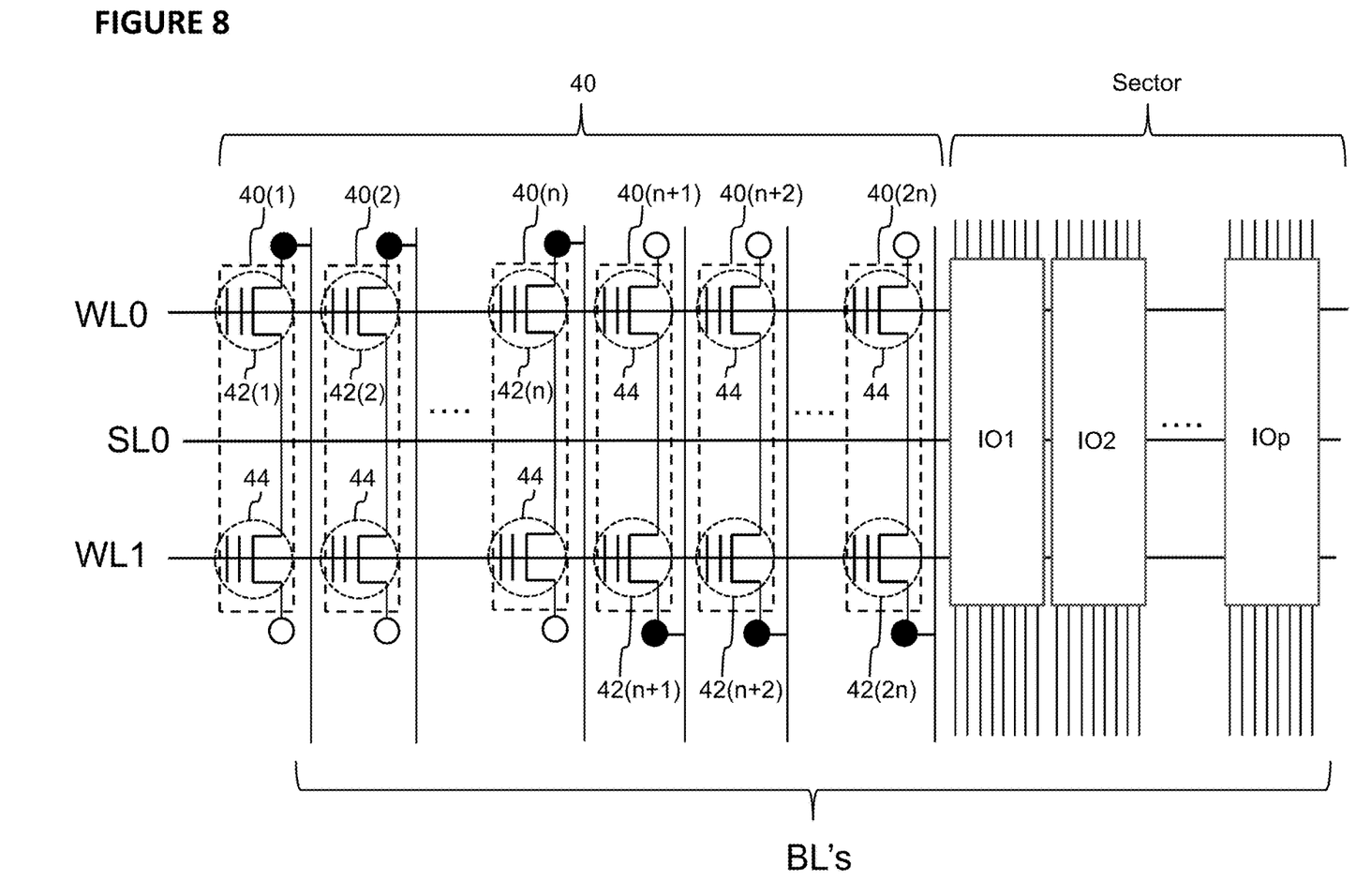
FIG. 8 is a schematic and layout drawing for the memory device of the present invention.
Figure 9:
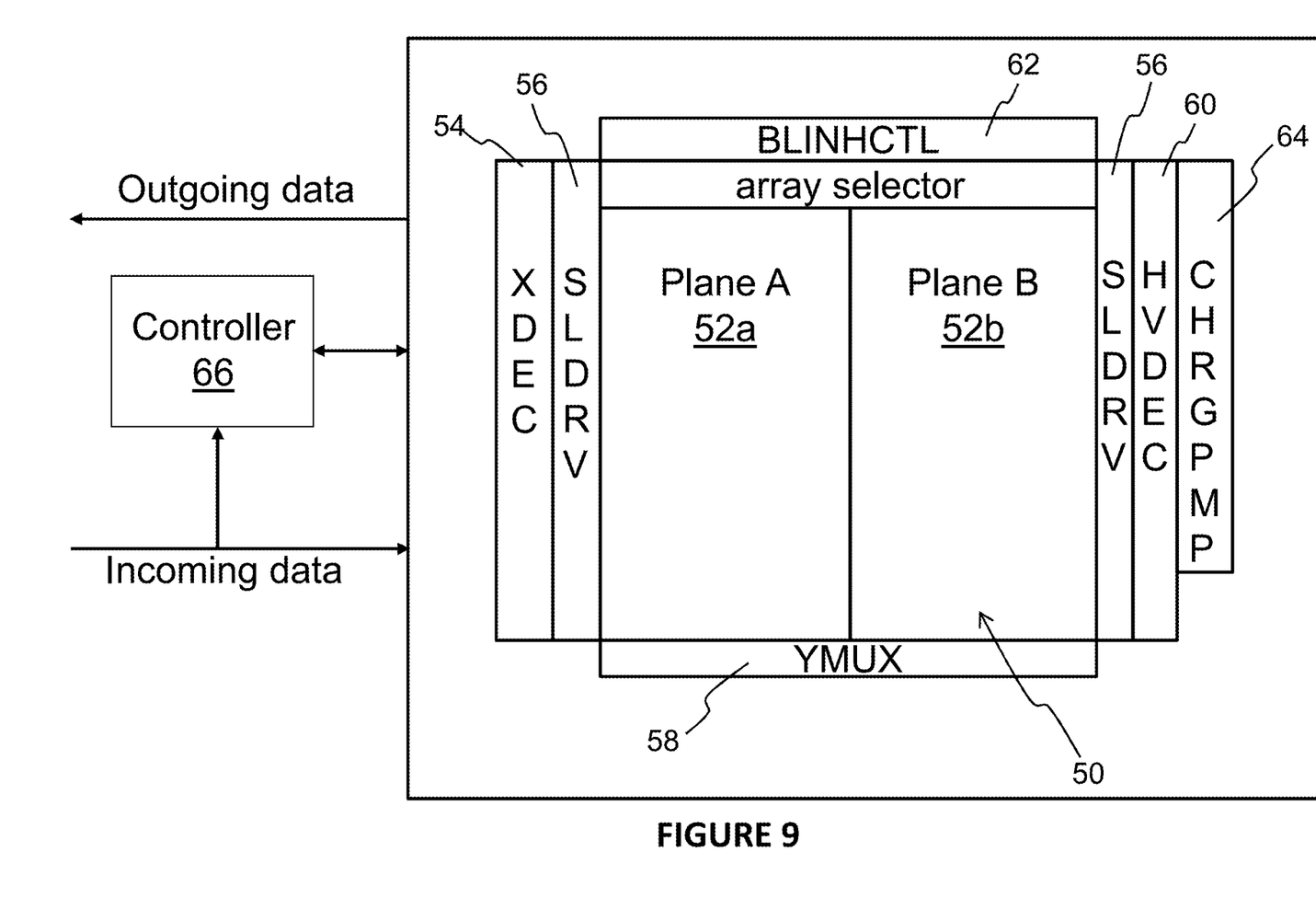
FIG. 9 is a diagram showing the architecture of the memory device of the present invention.

The present invention improves upon conventional memory cell architectures by providing index bit memory cells for all of the physical words in the IO groups. As shown in FIG. 8, the memory array includes index units 40 for IO groups IO1-IOp, preferably in the same rows of memory cells as IO groups IO1-IOp. Each index unit 40 includes an index memory cell 42 that is associated with one of the physical words. Specifically, index unit 40(1) with index memory cell 42(1) corresponds to the first physical word of memory cells 10(1) in IO groups IO1-IOp, index unit 40(2) with index memory cell 42(2) corresponds to the second physical word of memory cells 10(2) in IO groups IO1-IOp, and so on, where the last index unit 40(2n) with index memory cell 42(2n) corresponds to the last physical word of memory cells 10(2n) in IO groups IO1-IOp. It is preferable that each index memory cell 42 be located in the same single row as the physical word memory cells 10 to which it corresponds, so that they all can be programmed or erased in the same operation. Therefore, index memory cells 42(1)-42(n) are located in the top row, and index memory cells 42(n+1)-42(2n) are located in the bottom row. However, it is also preferable not to locate two index memory cells 42 in the same single column, so all the index memory cells 42 can be read out together. Therefore, each index unit 40 will include dummy cells 44 for the memory cell rows not containing the index memory cell 42. So, in the example of FIG. 8, index units 40(1)-40(n) include index memory cells 42(1)-42(n) in the top row, and dummy memory cells 44 in the bottom row. Similarly, index units 40(n+1)-40(2n) include index memory cells 42(n+1)-42(2n) in the bottom row, and dummy memory cells 44 in the top row. Dummy memory cells 44 are memory cells that are not used to store data. In order to prevent the dummy cells 44 from interfering with the operation of other memory cells, each dummy cell 44 preferably lacks an electrical connection to the respective bit line BL (e.g., the bit line contact 24 is severed or not even formed for that dummy memory cell).

Figure 10:
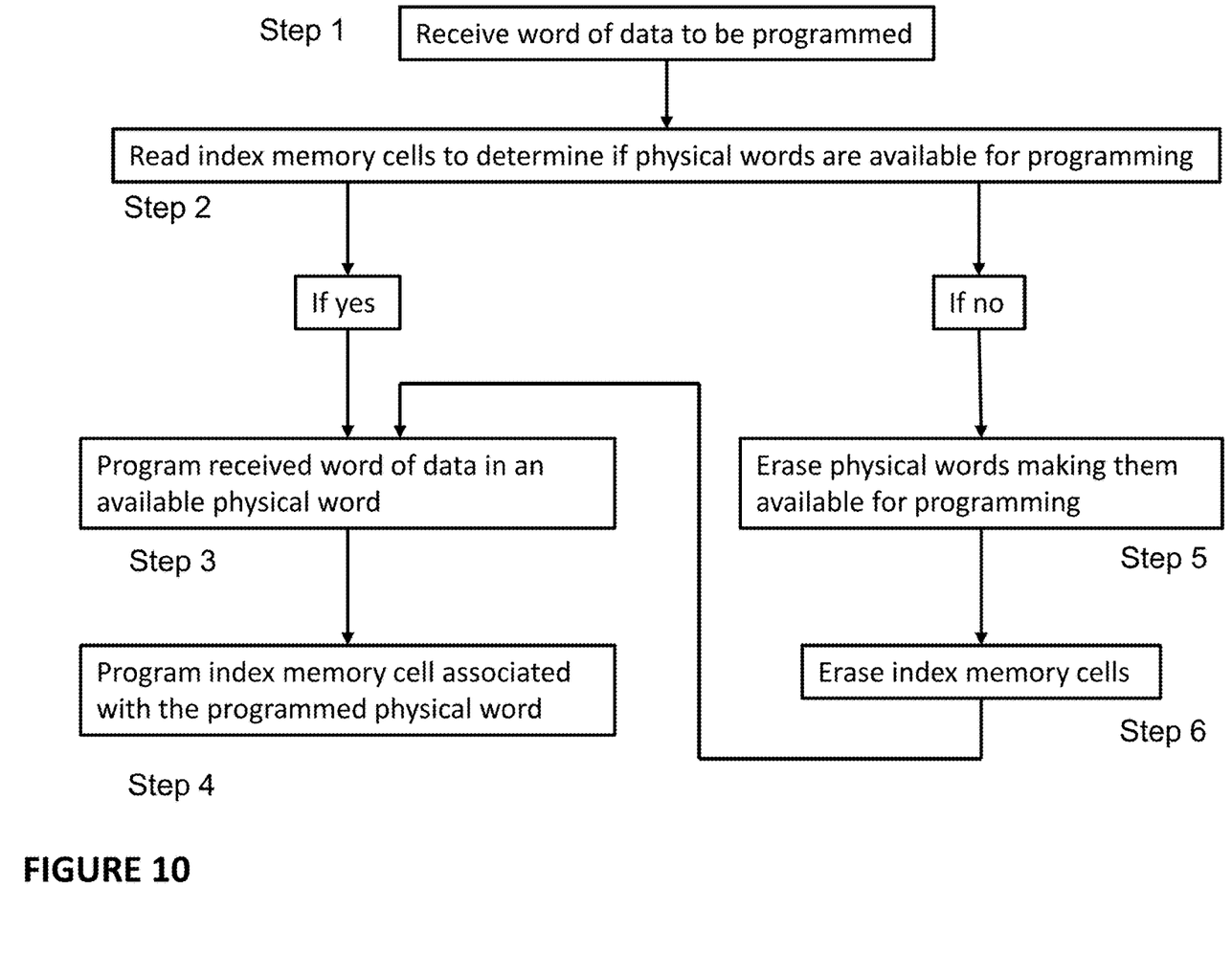
FIG. 10 is a flow chart showing the steps in programming data to the physical words.

The index memory cells 42 store index bit information that is used by the memory device controller 66 which is described next. The architecture of an exemplary memory device is illustrated in FIG. 10. The memory device includes an array 50 of the previously described non-volatile memory cells 10, 40 and 44, which can be segregated into two separate planes (Plane A 52a and Plane B 52b). The memory cells 10, 40, 44 are formed on a single chip, arranged in a plurality of rows and columns in the semiconductor substrate 12. Adjacent to the array of non-volatile memory cells are address decoders and power supply circuits (e.g. XDEC 54 (LV row decoder), SLDRV 56, YMUX 58(column decoder), HVDEC 60 (HV row decoder) and a bit line controller (BLINHCTL 62), which are used to decode addresses and supply the various voltages to the various memory cell gates and regions during read, program, and erase operations for selected memory cells. Column decoder 58 includes one or more sense amplifiers for measuring the currents on the bit lines BL during a read operation. Controller 66 (containing control circuitry) controls the various device elements to implement each operation (program, erase, read) on target memory cells, including the operation and use of the memory cells 10 and index memory cells 42 described herein. Charge pump CHRGPMP 64 provides the various voltages used to read, program and erase the memory cells under the control of the controller 66.

Controller 66 is configured to program, use and erase the index bit information in index memory cells 42 for the IO groups of memory cells described herein as follows. When the sector containing IO groups IO1-IOp is originally configured, all memory cells 10 and index memory cells 42 in the sector are erased (e.g., erased to the "1" state). The "1" state in the index memory cells 42 indicates that all the physical words in IO groups IO-IOp are erased and available to be programmed (without needing any pre-erase first). Thereafter, each time one or more incoming words of data are to be programmed into and stored in IO groups IO1-IOp, the controller 66 will first read the status of index memory cells 42. If that status indicates that enough physical words are available to store the incoming word(s) of data, then the controller will program that data into the available memory cells without performing an erase operation first. If, however, that status indicates that there are not enough physical words available to store the incoming word(s) of data, then the controller will perform a sector erase first, so that the incoming data can then be programmed into the memory cells 10 of IO groups IO1-IOp.

Using FIG. 8 with n=8, p=8, IO group rows=2, as a non-limiting example, the initial values of the index bit information in index memory cells 42 for all sixteen physical words in IO groups IO1-IO8 after the sector erase will all be 1's (1111111111111111), indicating that all physical words have been erased without any intervening programming and thus all are available for programming without any need for further erasing. When an incoming word of data is to be programmed into IO groups IO1-IO8 (see step 1 of FIG. 10), the controller 66 will read out the index bit information from index memory cells 42(1)-42(16) (see step 2 of FIG. 10), which will indicate that all sixteen physical words are erased and available for programming (without any need for a pre-erase first). The controller 66 will then program the word of data into one of the available physical words (e.g., the first physical word) (see step 3 of FIG. 10), and program its corresponding index memory cell 42 to a 0 state (see step 4 of FIG. 10). It should be noted that programming data consisting of combinations of 1's and/or 0's into a group of memory cells (e.g. a physical word of cells) does not necessarily mean that every memory cell in the group of memory cells is programmed to its program state. Rather, programming data into a group of memory cells as used herein means that some memory cells in the group may be programmed to their program state while other memory cells in the group may be left in their erased state, so that the combination of program and erase states of the group of memory cells reflect the 0's and 1's of the incoming data being stored, or vice versa. Therefore, it can also include programming all of the memory cells in the group to their programmed state ("0") (e.g., if the incoming data is all 0's, or all 1's if the controller correlates 1 data with 0 memory cell state). Similarly, it could also include leaving all the memory cells in the group in their erased state ("1") (e.g., if the incoming data is all 1's, or all 0's if the controller correlates 0 data with 1 memory cell state)). At this point, the index bit information in index memory cells 42 for all sixteen physical words in IO groups IO1-IO8 will be (0111111111111111), indicating that all physical words in IO groups IO1-IO8 are erased and available for programming (without the need to perform a pre-erase) except for the first physical word. Going forward, if the controller ever needs to program data into the first physical word, the index bit information will indicate to the controller that there has been a programming of that physical word since the last erase operation, and another erase operation would need to be performed before that physical word is programmed again.

At any point in time, the controller 66 can use the index bit information to determine which physical words are still available for programming without having to perform an erase operation, and continue programming without performing any erase operation. For example, continuing with the present example, when the next word of data is to be programmed to IO groups IO1-IO8, the index bit information would indicate to the controller that the second physical word is available, where the second physical word and its index memory cell 42 are programmed. Afterward, the index bit information will then be (0011111111111111), indicating that the first two physical words have been programmed since the last erase operation, and the others have not and are available for programming without performing an erase operation first. Programming of physical words in IO groups IO1-IO8 can continue without any erase operation so long as there is at least one physical word who's index memory cell indicates programming can be performed (i.e. "1"). When the index information is (0000000000000000), this indicates that all physical words in IO groups IO1-IO8 have been programmed since the last erase operation, and if any of these physical words are to be programmed, then an erase operation must be performed first (see step 5 of FIG. 10). When an erase operation is performed on IO groups IO1-IO8, the corresponding index memory cells 42 are erased too to reset them to the "1" status (see step 6 of FIG. 10), and then programming can proceed in one of the available physical words.

Accordingly, the index information stored in the index memory cells 42 of index units 40 provides a real time status indicator (to the controller 66, and/or even to a controller off chip) of which physical words in IO groups IO-IOp have been programmed since the last erase operation (represented by the "0" state), and which not been programmed since the last erase operation (represented by the "1" state). This allows the controller 66 to safely program data into memory cells without necessarily performing an erase operation first. Avoiding unnecessary erase operations during program operations provides a faster program operation and reduces unnecessary wear on the memory cells.

The index bit information in the index memory cells 42 can also be used during read operations. Specifically, when the controller 66 starts a read operation, it may want to access just the latest updated physical word. In that case, the controller 66 can first read the associated index memory cells 42 to determine which of the plurality of physical words was programmed most recently since their last respective erase operation. The controller could then expedite the read operation by avoiding reading other physical words that are either obsoleted (not the latest programmed) or non-programmed since their last respective erase operation. For example, when index information is (0001111111111111), which represents physical word 3 is the latest programmed word (assuming the physical words are programmed in sequential order by index information), physical words 1 and 2 are obsoleted, and physical words 4-16 are un-used. Therefore, in the read operation, only physical word 3 is read out.

Figure 11:
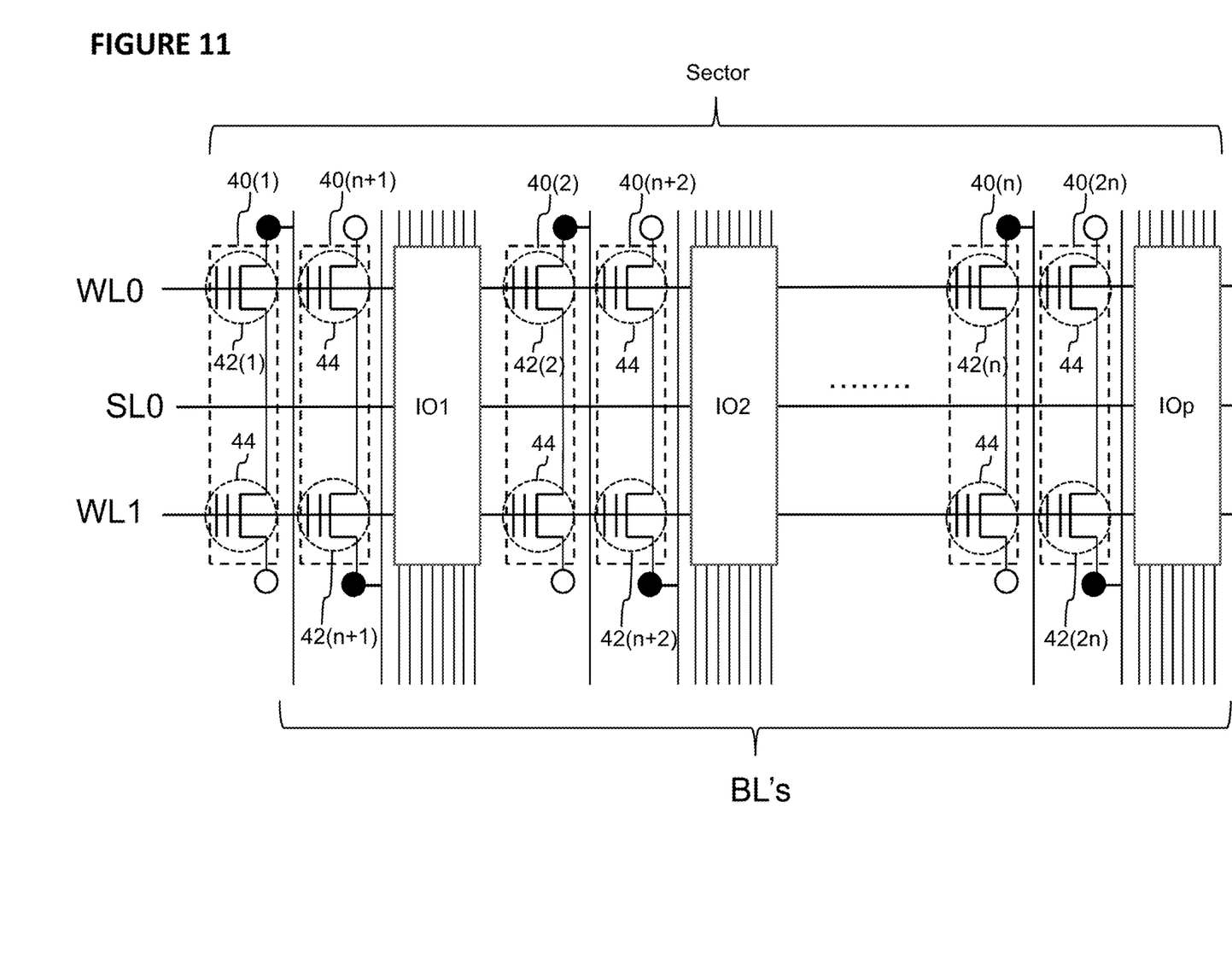
FIG. 11 is a schematic and layout drawing for an alternate embodiment of the memory device of the present invention.

While FIG. 8 shows the index units grouped together, they need not be. For example, FIG. 11 illustrates an alternate embodiment, where one index unit 40 for each row is located immediately adjacent one of the IO groups. This configuration can increase array efficiency by sharing source line pick-up between index units and IO groups. In contrast, with the configuration in FIG. 7, each index bit requires a dedicated source line pick-up, otherwise there could be a large IR drop when all the index memory cells 42 are read out at the same time. Locating the index units 40 in the same rows as the memory cells 10 of the corresponding IO groups is preferable, so that they can be programmed and erased using the same operations as programming and erasing the corresponding memory cells 10. However, the index units 40 for IO groups IO-IOp could be located anywhere in the memory array, or even in a separate location on the same chip.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Moreover, while the figures show a sector including just two rows and one set of IO groups IO-IOp, a sector of memory cells can include more than two rows and can include multiple sets of IO groups IO1-IOp. Similarly, while one set of IO groups IO-IOp are shown to include two memory cell rows, they could include just one memory cell row or more than two rows of memory cells. And, while the index units 40 are shown to include the same numbers of memory cell rows as the corresponding IO groups IO1-IOp, the number of memory cell rows in the index units 40 could be different than that for the corresponding IO groups. While the index cells are described above as having an initial erase state and thereafter being programmed to a program state when its associated physical word is programmed, the opposite may be the case, where the index cells are originally set to a programmed state to indicate program availability, and set to an erase state when its associated physical word is programmed (however this would require the ability to individually erase the index memory cells). Materials, processes and numerical examples described above are exemplary only, and should not be deemed to limit the claims. Further, as is apparent from the claims and specification, not all method steps need be performed in the exact order illustrated or claimed, but rather in any order that allows the proper formation or operation of the memory device of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

What is claimed is:
1. A memory device, comprising:
 a memory array that includes pluralities of non-volatile memory cells;
 a plurality of index memory cells each associated with a different one of the pluralities of the non-volatile memory cells; and
 a controller configured to:
  erase the pluralities of non-volatile memory cells,
  set each of the index memory cells to a first state,
  program first data into the memory array by:
   reading the plurality of index memory cells and determining that a first one of the index memory cells is in the first state,
   programming the first data into the plurality of the non-volatile memory cells associated with the first one of the index memory cells, and
   setting the first one of the index memory cells to a second state different from the first state;
 wherein:
  the pluralities of memory cells are arranged in rows and columns that also include the plurality of index memory cells;

all of the non-volatile memory cells in the plurality of
non-volatile memory cells associated with the first
one of the index memory cells, and the first one of
the index memory cells, are located in a single one
of the rows;
the pluralities of memory cells are arranged in IO
groups, where each of the IO groups includes only
one non-volatile memory cell from each of the
pluralities of non-volatile memory cells;
for each of the IO groups, some of the non-volatile
memory cells in the IO group are located in a first of
the rows and others of the non-volatile memory cells
in the IO group are located in a second of the rows;
some of the index memory cells are located in the first
row, and others of the index memory cells are located
in the second row;
for each of the index memory cells located in the first
row, the memory device further includes a dummy
memory cell that is located in the second row and in
a same column that contains the index memory cell;
and
for each of the index memory cells located in the
second row, the memory device further includes a
dummy memory cell that is located in the first row
and in a same column that contains the index
memory cell.

2. The device of claim 1, wherein the index memory cells are non-volatile memory cells and wherein the first state is an erased state and the second state is a programmed state.

3. The device of claim 2, wherein:
the setting of each of the index memory cells to a first state includes erasing each of the index memory cells to the erased state; and
the setting of the first one of the index memory cells to the second state includes programming the first one of the index memory cells to the programmed state.

4. The device of claim 1, wherein the controller is further configured to:
program second data into the memory array by:
reading the plurality of index memory cells and determining that a second one of the index memory cells is in the first state,
programming the second data into the plurality of the non-volatile memory cells associated with the second one of the index memory cells, and
setting the second one of the index memory cells to the second state.

5. The device of claim 1, wherein the controller is further configured to:
read the plurality of index memory cells and determine that all of the index memory cells are in the second state, and in response:
erase the pluralities of the non-volatile memory cells, and
set each of the index memory cells to the first state.

6. The device of claim 1, wherein the controller is further configured to:
program second data into the memory array by:
reading the plurality of index memory cells and determining that all of the index memory cells are in the second state,
erasing the pluralities of the non-volatile memory cells,
setting each of the index memory cells to the first state,
programming the second data into the plurality of the non-volatile memory cells associated with one of the index memory cells, and
setting the associated one of the index memory cells to the second state.

7. The device of claim 1, wherein the memory array, the plurality of index memory cells and the controller are contained in a single semiconductor chip.

8. A memory device, comprising
a memory array that includes pluralities of non-volatile memory cells;
a plurality of index memory cells each associated with a different one of the pluralities of the non-volatile memory cells; and
a controller configured to:
erase the pluralities of non-volatile memory cells,
set each of the index memory cells to a first state,
program first data into the memory array by:
reading the plurality of index memory cells and determining that a first one of the index memory cells is in the first state,
programming the first data into the plurality of the non-volatile memory cells associated with the first one of the index memory cells, and
setting the first one of the index memory cells to a second state different from the first state;
wherein:
the pluralities of memory cells are arranged in rows and columns that also include the plurality of index memory cells;
all of the non-volatile memory cells in the plurality of non-volatile memory cells associated with the first one of the index memory cells, and the first one of the index memory cells, are located in a single one of the rows;
the pluralities of memory cells are arranged in TO groups, where each of the IO groups includes only one non-volatile memory cell from each of the pluralities of non-volatile memory cells;
for each of the TO groups, some of the non-volatile memory cells in the TO group are located in a first of the rows and others of the non-volatile memory cells in the TO group are located in a second of the rows;
some of the index memory cells are located in the first row, and others of the index memory cells are located in the second row;
each of the IO groups is located in a plurality of the columns that do not contain any of the other IO groups; and
for any two of the IO groups, at least one of the index memory cells is located in one of the columns that is between the two pluralities of the columns for the two IO groups.

9. A method of operating a memory device that comprises a memory array that includes pluralities of non-volatile memory cells and a plurality of index memory cells each associated with a different one of the pluralities of the non-volatile memory cells, the method comprising:
erasing the pluralities of non-volatile memory cells,
setting each of the index memory cells to a first state,
programming first data into the memory array by:
reading the plurality of index memory cells and determining that a first one of the index memory cells is in the first state,
programming the first data into the plurality of the non-volatile memory cells associated with the first one of the index memory cells, and
setting the first one of the index memory cells to a second state different from the first state;

wherein:
the pluralities of memory cells are arranged in rows and columns that also include the plurality of index memory cells;
all of the non-volatile memory cells in the plurality of non-volatile memory cells associated with the first one of the index memory cells, and the first one of the index memory cells are located in a single one of the rows;
the pluralities of memory cells are arranged in TO groups, where each of the IO groups includes only one non-volatile memory cell from each of the pluralities of non-volatile memory cells;
for each of the TO groups, some of the non-volatile memory cells in the TO group are located in a first of the rows and others of the non-volatile memory cells in the TO group are located in a second of the rows;
some of the index memory cells are located in the first row, and others of the index memory cells are located in the second row;
for each of the index memory cells located in the first row, the memory device further includes a dummy memory cell that is located in the second row and in a same column that contains the index memory cell; and
for each of the index memory cells located in the second row, the memory device further includes a dummy memory cell that is located in the first row and in a same column that contains the index memory cell.

10. The method of claim 9, the index memory cells are non-volatile memory cells and wherein the first state is an erased state and the second state is a programmed state.

11. The method of claim 10, wherein:
the setting of each of the index memory cells to a first state includes erasing each of the index memory cells to the erased state; and
the setting of the first one of the index memory cells to the second state includes programming the first one of the index memory cells to the programmed state.

12. The method of claim 9, further comprising:
programming second data into the memory array by:
reading the plurality of index memory cells and determining that a second one of the index memory cells is in the first state,
programming the second data into the plurality of the non-volatile memory cells associated with the second one of the index memory cells, and
setting the second one of the index memory cells to the second state.

13. The method of claim 9, further comprising:
reading the plurality of index memory cells and determining that all of the index memory cells are in the second state, and in response:
erasing the pluralities of the non-volatile memory cells, and
setting each of the index memory cells to the first state.

14. The method of claim 9, further comprising:
programming second data into the memory array by:
reading the plurality of index memory cells and determining that all of the index memory cells are in the second state,
erasing the pluralities of the non-volatile memory cells,
setting each of the index memory cells to the first state,
programming the second data into the plurality of the non-volatile memory cells associated with one of the index memory cells, and
setting the associated one of the index memory cells to the second state.

15. A method of operating a memory device that comprises a memory array that includes pluralities of non-volatile memory cells and a plurality of index memory cells each associated with a different one of the pluralities of the non-volatile memory cells, the method comprising:
erasing the pluralities of non-volatile memory cells,
setting each of the index memory cells to a first state,
programming first data into the memory array by:
reading the plurality of index memory cells and determining that a first one of the index memory cells is in the first state,
programming the first data into the plurality of the non-volatile memory cells associated with the first one of the index memory cells, and
setting the first one of the index memory cells to a second state different from the first state;
wherein:
the pluralities of memory cells are arranged in rows and columns that also include the plurality of index memory cells;
all of the non-volatile memory cells in the plurality of non-volatile memory cells associated with the first one of the index memory cells, and the first one of the index memory cells are located in a single one of the rows;
the pluralities of memory cells are arranged in TO groups, where each of the IO groups includes only one non-volatile memory cell from each of the pluralities of non-volatile memory cells;
for each of the TO groups, some of the non-volatile memory cells in the TO group are located in a first of the rows and others of the non-volatile memory cells in the TO group are located in a second of the rows;
some of the index memory cells are located in the first row, and others of the index memory cells are located in the second row;
each of the TO groups is located in a plurality of the columns that do not contain any of the other TO groups; and
for any two of the TO groups, at least one of the index memory cells is located in one of the columns that is between the two pluralities of the columns for the two IO groups.

* * * * *